(12) United States Patent
Ikeda

(10) Patent No.: US 6,314,045 B1
(45) Date of Patent: Nov. 6, 2001

(54) SEMICONDUCTOR MEMORY DEVICE WITH A PLURALITY OF MEMORY BLOCKS

(75) Inventor: Yutaka Ikeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/668,172

(22) Filed: Sep. 25, 2000

(30) Foreign Application Priority Data

Apr. 12, 2000 (JP) ................................................. 12-110500

(51) Int. Cl.⁷ ....................................................... G11C 7/00
(52) U.S. Cl. ................ 365/230.03; 365/189.01; 365/189.08; 365/191; 365/205; 365/202
(58) Field of Search ........................ 365/189.01, 189.03, 365/189.05, 189.08, 190, 191, 202, 205, 230.03

(56) References Cited

U.S. PATENT DOCUMENTS

| | | |
|---|---|---|
| 5,592,434 * | 1/1997 | Iwamoto et al. ..................... 365/233 |
| 5,886,936 | 3/1999 | Yang . |
| 6,028,810 * | 2/2000 | Ooishi et al. .................... 365/230.03 |
| 6,067,260 * | 5/2000 | Ooishi et al. ........................ 365/200 |
| 6,175,532 * | 1/2001 | Ooishi ............................ 365/230.03 |
| 6,192,002 * | 2/2001 | Meritt ................................. 365/233 |
| 6,198,679 * | 3/2001 | Nakasu et al. ...................... 365/203 |
| 6,212,109 * | 4/2001 | Proebsting ........................... 365/190 |

FOREIGN PATENT DOCUMENTS

| | | |
|---|---|---|
| 408212777A * | 8/1996 | (JP) . |
| 10-69776 | 3/1998 | (JP) . |
| 10-283772 | 10/1998 | (JP) . |
| 11-144464 | 5/1999 | (JP) . |

\* cited by examiner

Primary Examiner—Viet Q. Nguyen

(57) ABSTRACT

In accordance with the present invention a semiconductor memory device includes a connection control circuit controlling a connection between a bit line pair and a data input/output line pair. The connection control circuit includes a flip flop. The connection control circuit responds to a sense amplifier activation signal and a column bank address by setting a level of an interlock signal controlling a gate for electrically connecting the bit line pair and the data input/output line pair together.

5 Claims, 9 Drawing Sheets

SEMICONDUCTOR MEMORY DEVICE WITH A PLURALITY OF MEMORY BLOCKS

BACKGROUND OF THE INVENTION

1. Field of the Invention

The present invention relates generally to semiconductor memory devices and particularly to semiconductor memory devices having a plurality of banks.

2. Description of the Background Art

Conventionally there exist semiconductor memory devices having a plurality of banks. In such semiconductor memory devices, each bank includes a plurality of memory cells arranged in rows and columns, and a plurality of words lines corresponding to a plurality of rows and a plurality of bit lines corresponding to a plurality of columns. The banks can be activated and inactivated (or precharged) substantially independent of each other.

In such a semiconductor memory device, initially at a selected bank the data on a bit line pair connected to a selected word line is differentially amplified by a sense amplifier. Then, when a write/read instruction is received, a designated bit line pair and a data input/output line pair are electrically connected together. Thus data is written to a selected memory cell or data is read from a selected memory cell.

A data input/output line pair and a bit line pair are not allowed to be electrically connected together until a predetermined period of time elapses after a sense amplifier is activated.

This is because a period of time is required for the sense amplifier to sufficiently amplify a slight potential difference between the paired bit lines. Allowing a sense amplifier to amplify a potential difference between paired bit lines for longer periods of time ensures that the sense amplifier more reliably amplifies the potential difference between the paired bit lines.

On the other hand, according to a specification of the semiconductor device a read/write command can be input after a defined period tRCD elapses following the activation of a bank. As such, a bit line pair and a data input/output line pair must be allowed to be connected together if the defined period of time tRCD is satisfied.

As such, in a conventional semiconductor memory device a bit line pair and a data input/output line pair are connected together in response to a control signal (an interlock signal) output from a connection control circuit 900 shown in FIG. 10.

As shown in FIG. 10, connection control circuit 900 includes a delay stage 901 configured of inverters 902A, 902B, . . . and 902M, an inverter 903, and an NAND circuit 904. Inverters 902A, 902B, . . . and 902M are connected in series. Inverter 902A receives a sense amplifier activation signal φN. Delay stage 901 delays sense amplifier activation signal φN to output a signal φX. NAND circuit 904 receives sense amplifier activation signal φN and signal φX. Inverter 903 inverts an output from NAND circuit 904 and outputs an interlock signal CE.

Sense amplifier activation signal φN is provided to activate a sense amplifier. When a row select operation starts, a selected bank's sense amplifier activation signal φN is driven high, which is received by a sense amplifier, which amplifies a potential difference between paired bit lines connected thereto.

As shown in FIG. 11, when sense amplifier activation signal φN is driven high and a delay time (ΔD) provided by delay stage 901 then elapses, interlock signal CE is driven high.

When interlock signal CE is driven high, a selected column (a bit line pair) and a data input/output line pair are electrically connectable together via a gate (not shown). As such, when a sense amplifier is activated and a predetermined period of time ΔD then elapses a bit line pair and a data input/output line pair can be connected together.

However, if the conventional connection control circuit 900 is used interlock signal CE is activated at a timing determined depending on delay stage 901. As such, interlock signal CE would be activated at an offset timing depending on a condition of process, temperature or voltage. Thus it has been difficult to satisfy the defined period of time tRCD as well as ensure a sufficient margin.

SUMMARY OF THE INVENTION

The present invention has been made to overcome the disadvantage described above and contemplates a semiconductor memory device capable of connecting a bit line pair and a data input/output line pair at an optimal timing.

In accordance with the present invention, a semiconductor memory device includes a plurality of memory blocks each having a plurality of memory cells arranged in rows and columns, and a plurality of word lines and a plurality of bit line pairs; a data input/output line for allowing the plurality of memory blocks to communicate data externally; a select circuit responsive to an address signal for selecting a memory block; a control circuit providing control for activating a selected memory block and reading data from the selected memory block or writing data to the selected memory block; a gate receiving an active control signal to operate to connect a selected memory block and a data input/output line together; and a connection control circuit controlling an operation of the gate, wherein the connection control circuit sets the control signal inactive until there is received a read/write command designating a data read or a data write.

Preferably, the semiconductor memory device further includes a plurality of sense amplifiers each responsive to an active sense amplifier activation signal for differentially amplifying a potential difference between paired bit lines corresponding thereto, and the control circuit, which activates a selected memory block, includes a circuit activating a sense amplifier activation signal corresponding thereto and the connection control circuit sets the control signal inactive until a read/wlite command is input after a sense amplifier activation signal is activated.

Preferably, the data input/output line includes a plurality of local input/output lines and a global input/output line shared by the plurality of memory blocks, and the gate includes a plurality of select gates provided for the plurality of local input/output lines, respectively, and a plurality of switches arranged between their respective local input/output lines and the global input/output line, wherein the plurality of select gates are each responsive to the control signal for operating to allow a selected memory block and a local input/output line corresponding thereto to be electrically connectable together and the plurality of switches each selectively connect a local input/output line corresponding to a selected memory block and the global input/output line together when a read/write command is received.

Preferably, the semiconductor memory device also includes a command decoder decoding an input command, wherein the command decoder generates a timing signal when a read/write command is received, the select circuit when it receives the timing signal activates a column bank address designating a memory block subjected to a data read or a data write designated by an address signal, and the connection control circuit includes a logic circuit activating the control signal when it receives an active sense amplifier activation signal and a column bank address.

In particular, the logic circuit is configured of a flip flop receiving the sense amplifier activation signal and the column bank address.

Thus in the present invention the semiconductor memory device with a plurality of banks can have a selected bank and a data input/output line disconnected until a read/wlite command for the selected bank is received after a sense amplifier is activated. When the read/write command is applied a selected bank corresponding thereto and a data input/output line can be connected together.

Thus, connecting a data input/output line and a bit line together can be controlled at an optimal timing.

Furthermore, the flip flop configuring the connection control circuit generating the connection control signal (the interlock signal) input to the gate controlling the connection of a data input/output line and a bit line, allows the connection control signal to be activated at a less variable timing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
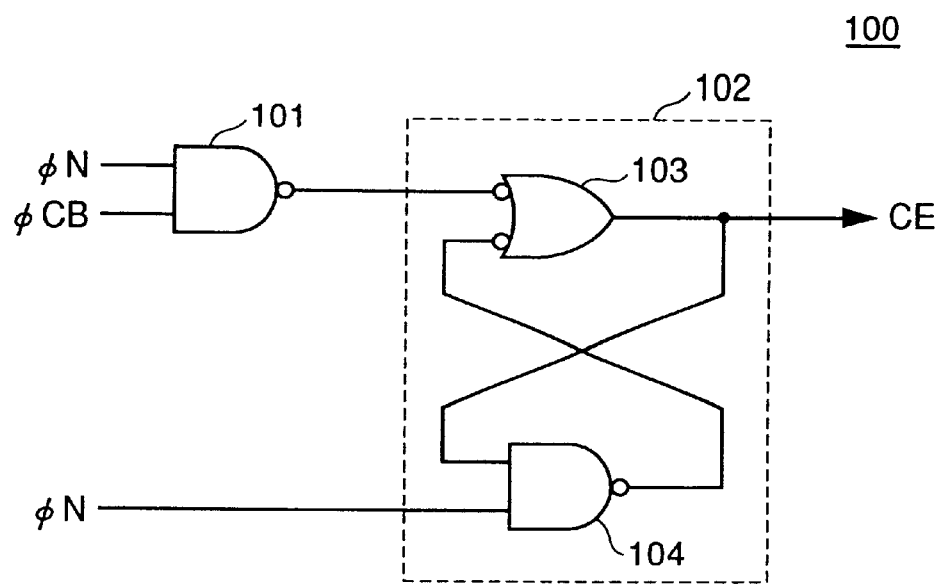
FIG. 1 shows a configuration of a connection control circuit 100 according to an embodiment of the present invention.

Hereinafter embodiments of the present invention will now be described in detail with reference to the drawings. In the figures, like portions are denoted by like reference characters and will thus not be described repeatedly. As an embodiment of the present invention a semiconductor memory device uses a connection control circuit 100 shown in FIG. 1 to control an electrical connection between a data input/output line pair used to communicate data externally and a bit line pair.

As shown in FIG. 1, connection control circuit 100 includes an NAND circuit 101 and a flip flop 102. NAND circuit 101 receives a sense amplifier activation signal $\phi N$ and a column bank address $\phi CB$.

Sense amplifier activation signal $\phi N$ activates a sense amplifier differentially amplifying a potential difference between paired bit lines. The sense amplifier operates in response to sense amplifier activation signal $\phi N$ driven high.

Column bank address $\phi CB$ is, as will be described hereinafter, a signal activated under a condition that a data read/write from/to a bank is designated.

Flip flop 102 is configured of a logic circuit (NAND circuit) 103 and an NAND circuit 104. Logic circuit 103 receives an output from NAND circuit 101 and that from NAND circuit 104 and outputs an interlock signal CE controlling a connection between a bit line pair and a data input/output line pair. NAND circuit 104 has an input receiving interlock signal CE and sense amplifier activation signal $\phi N$.

Figure 2:
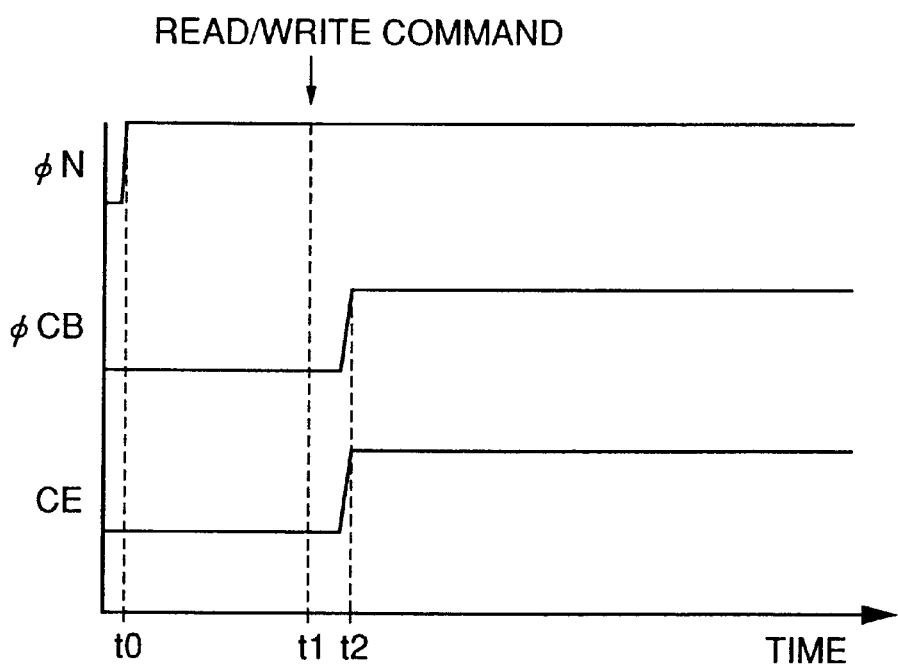
FIG. 2 is timing plots representing an operation of the FIG. 1 connection control circuit 100.

Connection control circuit 100 operates, as described with reference to FIG. 2. As shown in FIG. 2, when a bank is selected and a word line is also selected, sense amplifier activation signal $\phi N$ is activated (at time t0) for activating a sense amplifier provided for the selected bank. Then, when a read/write command corresponding to a write/read instruction is input (at time t1), column bank address $\phi CB$ corresponding to a bank subjected to the write/read operation is driven high (at time t2). When column bank address $\phi CB$ is driven high, interlock signal CE is driven high.

Figure 3:
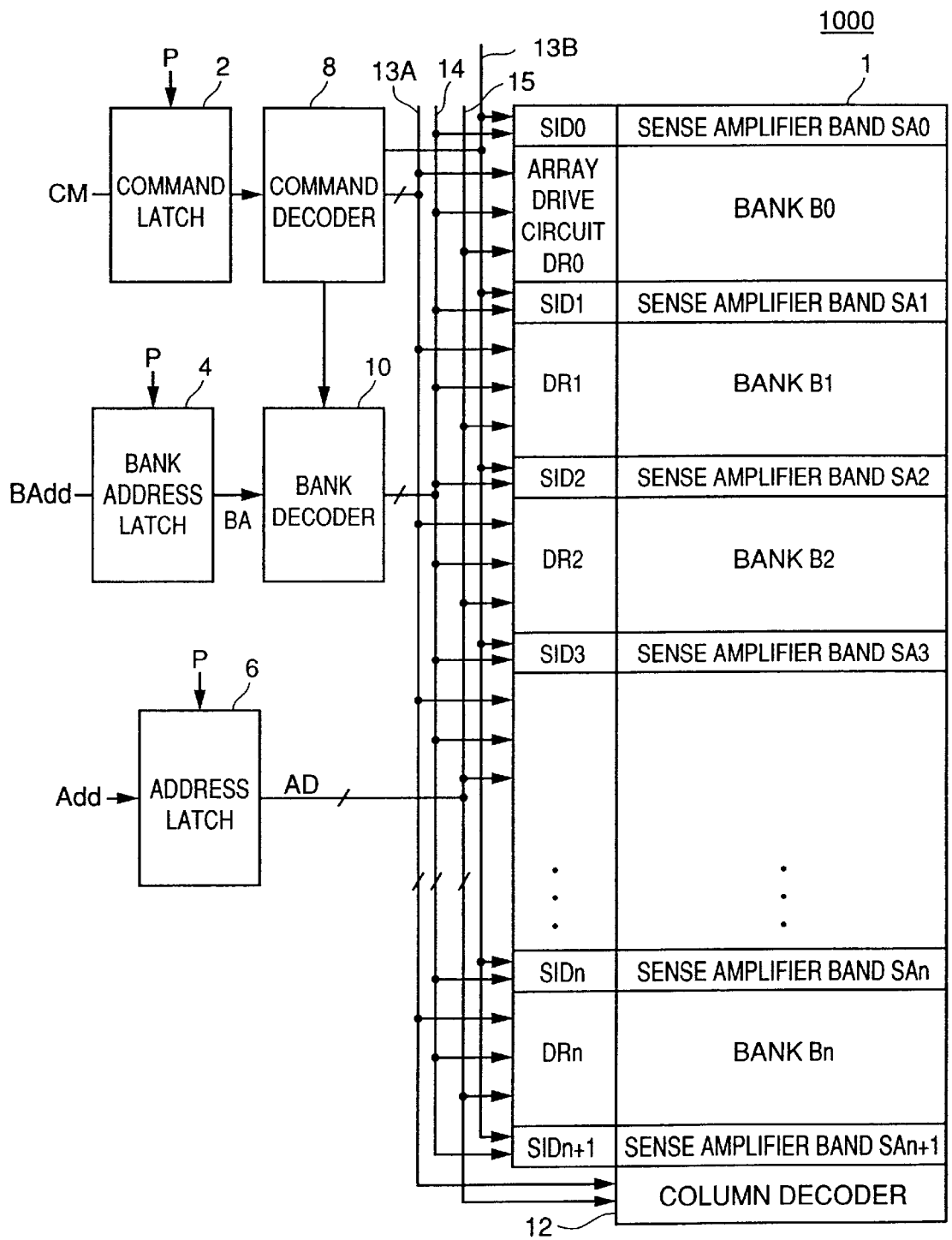
FIG. 3 is a block diagram showing a general configuration of semiconductor memory device 1000 according to an embodiment of the present invention.

An exemplary semiconductor memory device 1000 with such connection control circuit 100 will now be described with reference to FIG. 3. As shown in FIG. 3, semiconductor memory device 1000 is provided with a memory array portion 1 including a plurality of banks B0–Bn and sense amplifier bands SA0–SAn+1. Each bank includes a plurality of memory cells arranged in rows and columns, and a plurality of word lines arranged corresponding to a plurality of rows and a plurality of bit lines arranged corresponding to a plurality of columns. The sense amplifier bands are arranged to sandwich each bank. Adjacent banks share a sense amplifier band arranged therebetween (i.e., a shared sense amplifier configuration). When a selected bank is connected to the sense amplifier associated therewith, a non-selected bank paired with the selected bank is disconnected from the sense amplifier band associated therewith.

Semiconductor memory device 1000 also includes a command latch 2 synchronized with a clock signal P to latch an externally applied command CM, a bank address latch 4 synchronized with clock signal P to latch an externally applied bank address signal BAdd, an address latch 6 synchronized with clock signal P to latch an externally applied address signal Add, a command decoder 8 decoding the command latched by command latch 2, a bank decoder 10 controlled by command decoder 8 to decode bank address BA latched by bank address latch 4, to generate signals designating a bank (i.e., a row bank designation signal RB and a column bank designation signal CB), and a column decoder 12 responsive to an output from address latch 6 for selection in a column direction.

Command CM may be individual control signals, such as a row address strobe signal /RAS, a column address strobe signal /CAS and a wiite enable signal /WE, or it may be a combination in state of multiple control signals to designate a mode of operation. Command decoder 8 decodes input command CM to generate an internal control signal for controlling an internal operation.

Semiconductor memory device 1000 also includes array dcive circuits DR0–DRn provided for banks B0–Bn, respectively, to activate/inactivate their respective banks, and sense/connection control circuits SID0–SIDn+1 provided for sense amplifier bands SA0–SAn+1, respectively.

Array drive circuits DR0–DRn includes a circuit selecting and driving a row of a bank corresponding thereto (a row decoder and a word line driver), a circuit generating a control signal for precharging/equalizing bit lines in a bank corresponding thereto at a predetermined timing (a equalization signal BLEQ), and other circuits.

Array drive circuits DR0–DRN selects and drives a word line (a row) in response to an internal control signal received from command decoder 8, an internal address AD output from address latch 6, and row bank designation signal RB output from bank decoder 10.

Sense/connection control circuits SID0–SIDn+1 includes a circuit driving sense amplifier activation signal $\phi$N applied to a sense amplifier corresponding thereto, connection control circuit 100, a circuit controlling a connection/disconnection between a bank and a sense amplifier, a circuit controlling a connection between a local I/O line pair (I/O: input/output) provided for each sense amplifier band and a global I/O line pair shared by all of the banks, and other circuits.

An output from command decoder 8 is input to array drive circuits DR0–DRn and column decoder 12 on a control bus 13A and to sense/connection control circuits SID0–SIDn+1 on a control bus 13B.

An output from bank decoder 10 is applied on a bank designating bus 14 to array drive circuits DR0–DRn and sense/connection control circuits SID0–SIDn+1. Internal address AD latched by address latch 6 is transmitted on an internal address bus 15 to array dcive circuits DR0–DRn and column decoder 12.

Figure 4:
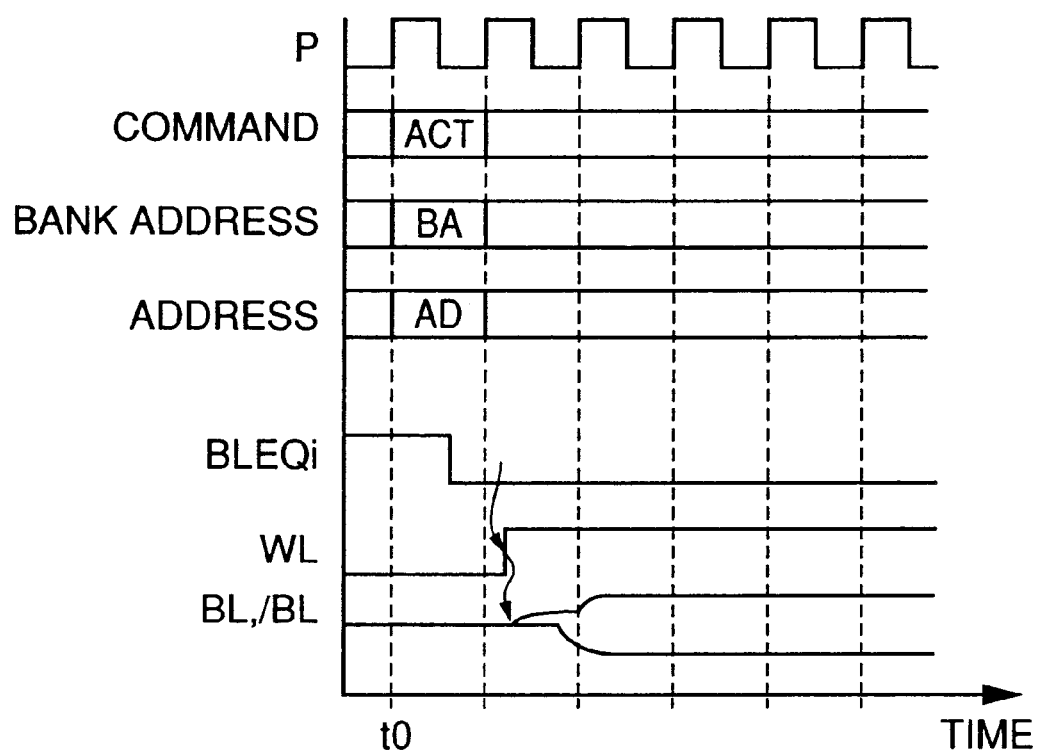
FIG. 4 is timing plots for illustrating an operation of an array drive circuit DRi.

Reference will now be made to FIG. 4 to describe an operation of array drive circuit DRi arranged for bank Bi, wherein i is equal to one to n. At time t0, synchronized with a clock signal P an active command ACT is applied to designate that a row in a selected bank is activated. Active command ACT is applied when clock signal P rises with row address strobe signal /RAS of low in level, column address strobe signal /CAS of high in level and write enable signal /WE of high in level.

Simultaneously with active command ACT, bank address BA and internal address AD are applied. Command decoder 8 decodes active command ACT to output a signal controlling array drive circuit DRi.

Bank decoder 10, controlled by command decoder 8, is activated to decode bank address BA input thereto. Then, row bank designation signal RB designating bank Bi is driven to the selected state.

Responsively, in array drive circuit DRi, an equalization signal BLEQi is inactivated. Bank Bi has a bit line pair having an intermediate potential (a precharging potential VBL), floating.

Furthermore, in array drive circuit DRi, internal address AD is decoded and a word line WL corresponding thereto is driven to the selected state.

Thus, the data stored in a memory cell connected to word line WL in the selected state, is transmitted to a bit line BL (or /BL). Between the bit lines BL and /BL a potential difference occurs due to the stored data. Then, a sense amplifier provided for bank Bi receives sense amplifier activation signal $\phi$Ni activated. The sense amplifier activated amplifies a slight potential difference between bit lines BL and /BL.

In this condition data will be read/written in response to a read/write command input for bank Bi.

Figure 5:
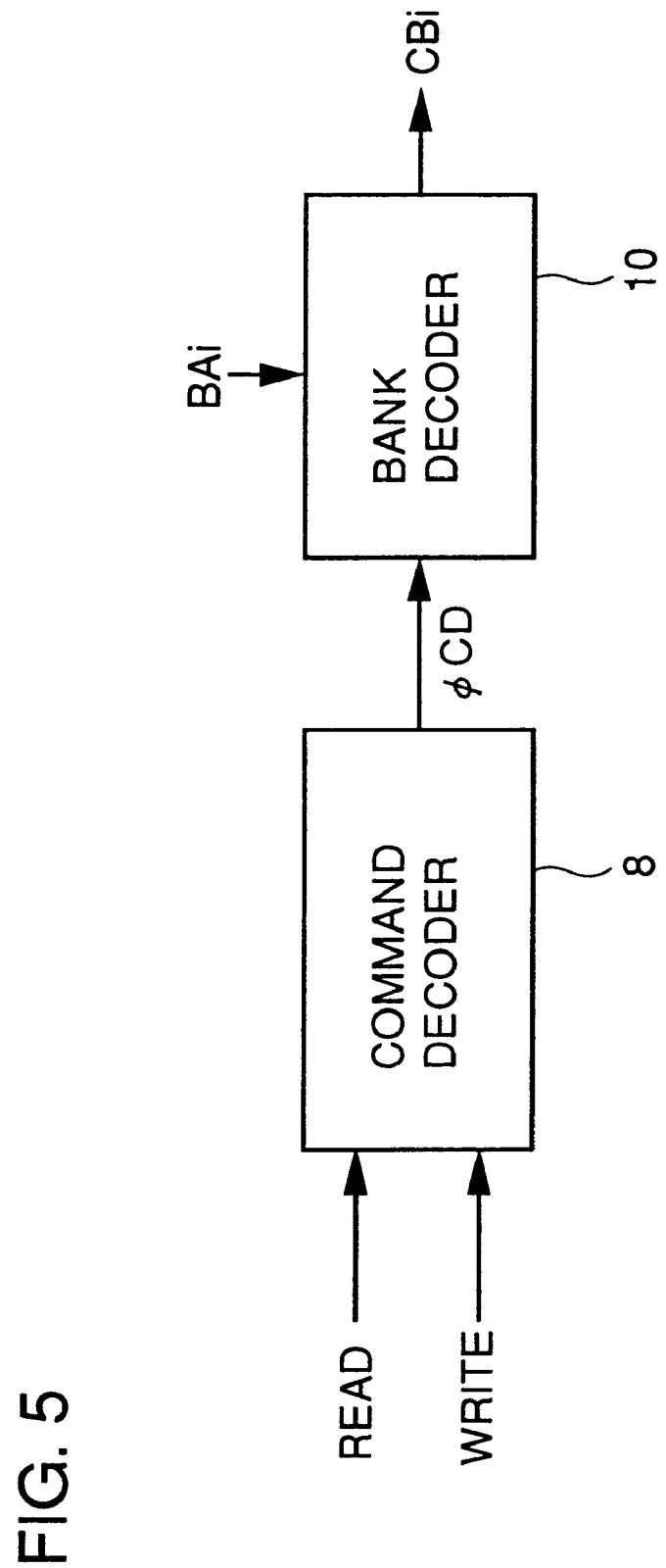
FIG. 5 shows a relation between a command decoder 8 and a bank decoder 10.
Figure 6:
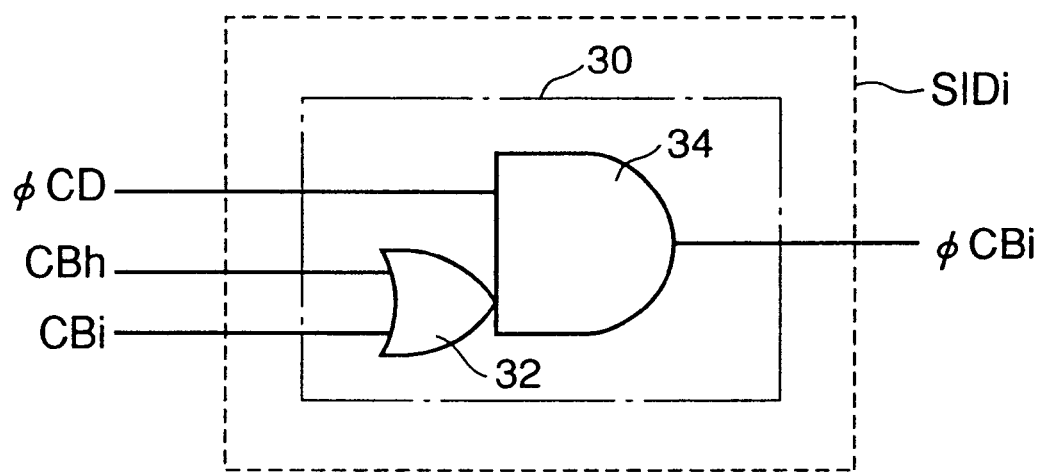
FIG. 6 shows a configuration of a bank select signal generating portion 30 included in a sense/connection control circuit.

Reference will now be made to FIGS. 5 and 6 to describe column bank address $\phi$CB input to connection control circuit 100. As shown in FIG. 5, when command decoder 8 receives a read command designating a data read operation (READ) or a write command designating a data write operation (WRITE), command decoder 8 generates a timing signal $\phi$CD of high in level.

Bank decoder 10, receiving timing signal $\phi$CD, activates or drives high a column bank designation signal CBi for bank Bi designated by input bank address BA and outputs the same. The other column bank designation signals remain low in level.

The sense/connection control circuit receives column bank designation signal CB and produces column bank address $\phi$CB fed to connection control circuit 100 corresponding thereto.

For the sake of convenience, sense amplifier bands SAi and SAj are arranged for bank Bi, wherein i is equal to one to n, and sense/connection control circuit SIDi is arranged for sense amplifier band SAi. Furthermore, bank Bh shares sense amplifier band SAi with bank Bi.

Sense/connection control circuit SIDi will be described as one example. As shown in FIG. 6, sense/connection control circuit SIDi includes a bank select signal generating portion 30, which includes an OR circuit 32 receiving column bank designation signals CBi and CBh and an AND circuit 34 receiving timing signal $\phi$CD and a signal output from OR circuit 32. In sense/connection control circuit SIDi AND circuit 34 outputs a column bank address $\phi$CBi.

Column bank designation signal CBi is activated when a read from or write to bank Bi is designated, and column bank designation signal CBh is activated when a read/write from/to bank Bh is designated.

When timing signal $\phi$CD is high in level and bank Bi or bank Bh adjacent thereto is also selected, AND circuit 34 outputs column bank address $\phi$CBi of high in level.

Thus, column bank address $\phi$CBi is activated or diiven high when a read/write command is input for bank Bi or Bh. When bank Bi is designated as being subjected to a read/write operation (i.e., column bank designation signal CBi is driven high), a column bank address is held inactive in a sense/connection control circuit receiving a column bank designation signal other than column bank designation signal CBi.

Figure 7:
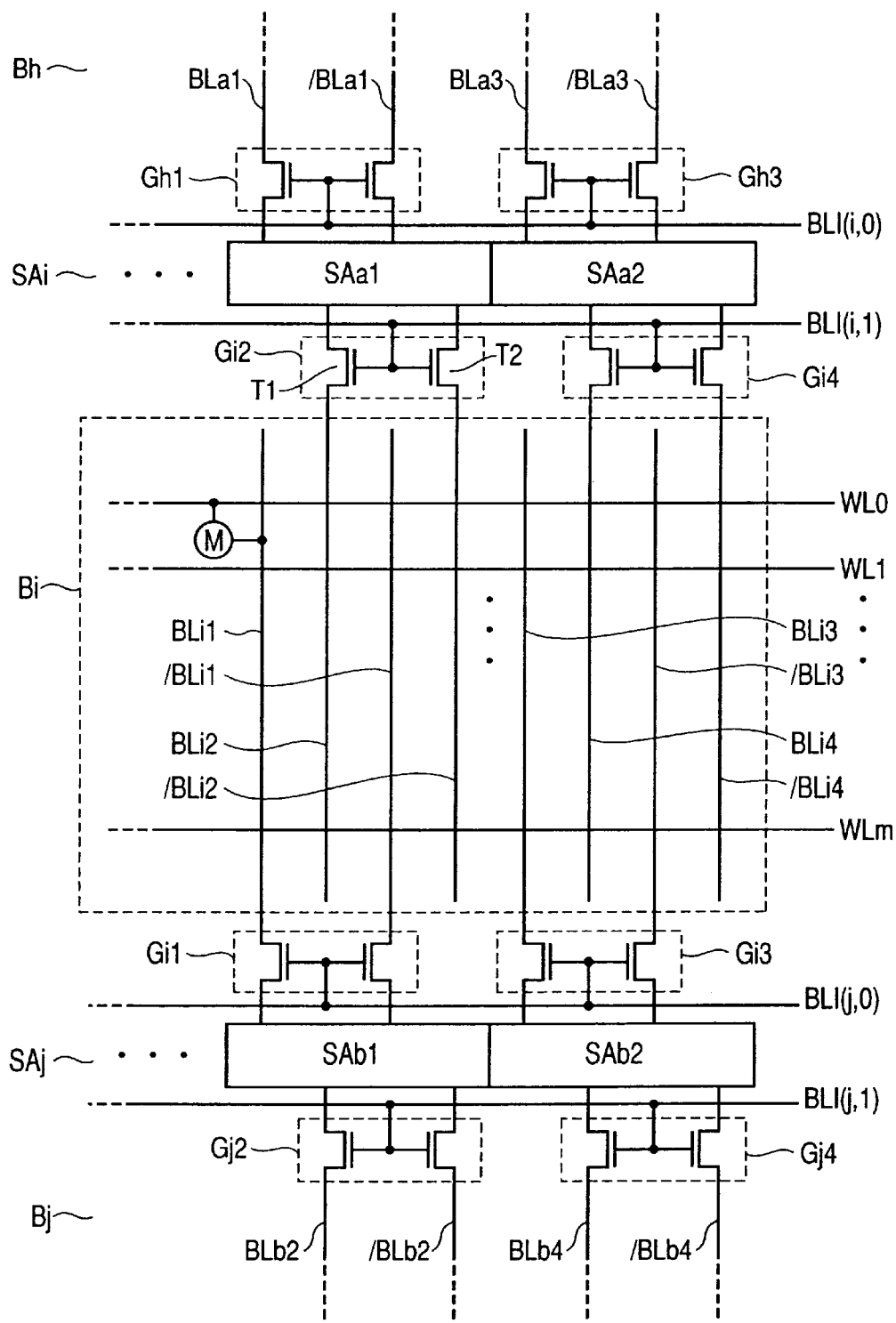
FIG. 7 illustrates a relation between a bank and a sense amplifier band.

Reference will now be made to FIG. 7 to describe a relation between a bank and a sense amplifier band in semiconductor memory device 1000. FIG. 7 representatively shows bank Bi, sense amplifier bands SAi and SAj sandwiching bank Bi, bank Bh sharing sense amplifier band SAi and bank Bj sharing sense amplifier band SAj.

Bank Bi includes a plurality of memory cells Ms arranged in rows and columns, and a word line corresponding to a row and having connected thereto memory cells Ms of the corresponding row and a bit line corresponding to a column and having connected thereto memory cells Ms of the corresponding column. In FIG. 7, WL0–WLm denote word lines, and BLi1 and /BLi1, BLi2 and /BLi2, BLi3 and /BLi3, BLi4 and /BLi4 denote bit line pairs. The bit line pairs are alternately connected to opposite sense amplifier bands SAi and SAj at a sense amplifier.

Bit line pair BLi1, /BLi1 is connected via a separation gate Gi1 to sense amplifier band SAj at a sense amplifier SAb1, and bit line pair BLi2, /BLi2 is connected via a separation gate Gi2 to sense amplifier band SAi at a sense amplifier SAa1.

Bit line pair BLi3, /BLi3 is connected via a separation gate Gi3 to sense amplifier band SAj at a sense amplifier SAb2, and bit line pair BLi4, /BLi4 is connected via a separation gate Gi4 to sense amplifier band SAi at a sense amplifier SAa2.

Separation gates Gi2, Gi4, . . . turn on/off in response to a gate control signal BLI (i, 1), and separation gates Gi1, Gi3, . . . turn on/off in response to a gate control signal BLI (j, 0).

Bank Bh has bit line pair BLa1, /BLa1 and bit line pair BLa3, /BLa3 connected via separation gates Gh1, Gh3 to sense amplifiers SAa1 and SAa2, respectively. Separation gates Gh1, Gh3 turn on/off in response to gate control signal BLI (i, 0). Bank Bj has bit line pair BLb2, /BLb2 and bit line pair BLb4, /BLb4 connected via separation gates Gj2, Gj4 to sense amplifiers SAb1 and SAb2, respectively. Separation gates Gj2, Gj4, . . . turn on/off in response to gate control signal BLI (j, 1).

The separation gate is configured of NMOS transistors T1 and T2. Gate control signals BLI (i, 0), BLI (i, 1), . . . are generated by a circuit included in sense/connection control circuit SIDi. The circuit in the standby state sets the gate control signal high and in response to a row bank designation signal drives the gate control signal.

Thus, in standby, banks Bi and Bh sharing sense amplifier band SAi are both connected to sense amplifier band SAi. When bank Bi is placed in the selected state, the circuit drives gate control signal BLI (i, 0) low and holds gate control signal BLI (i, 1) high. Thus, only the selected bank Bi is connected to sense amplifier band SAi.

Figure 8:
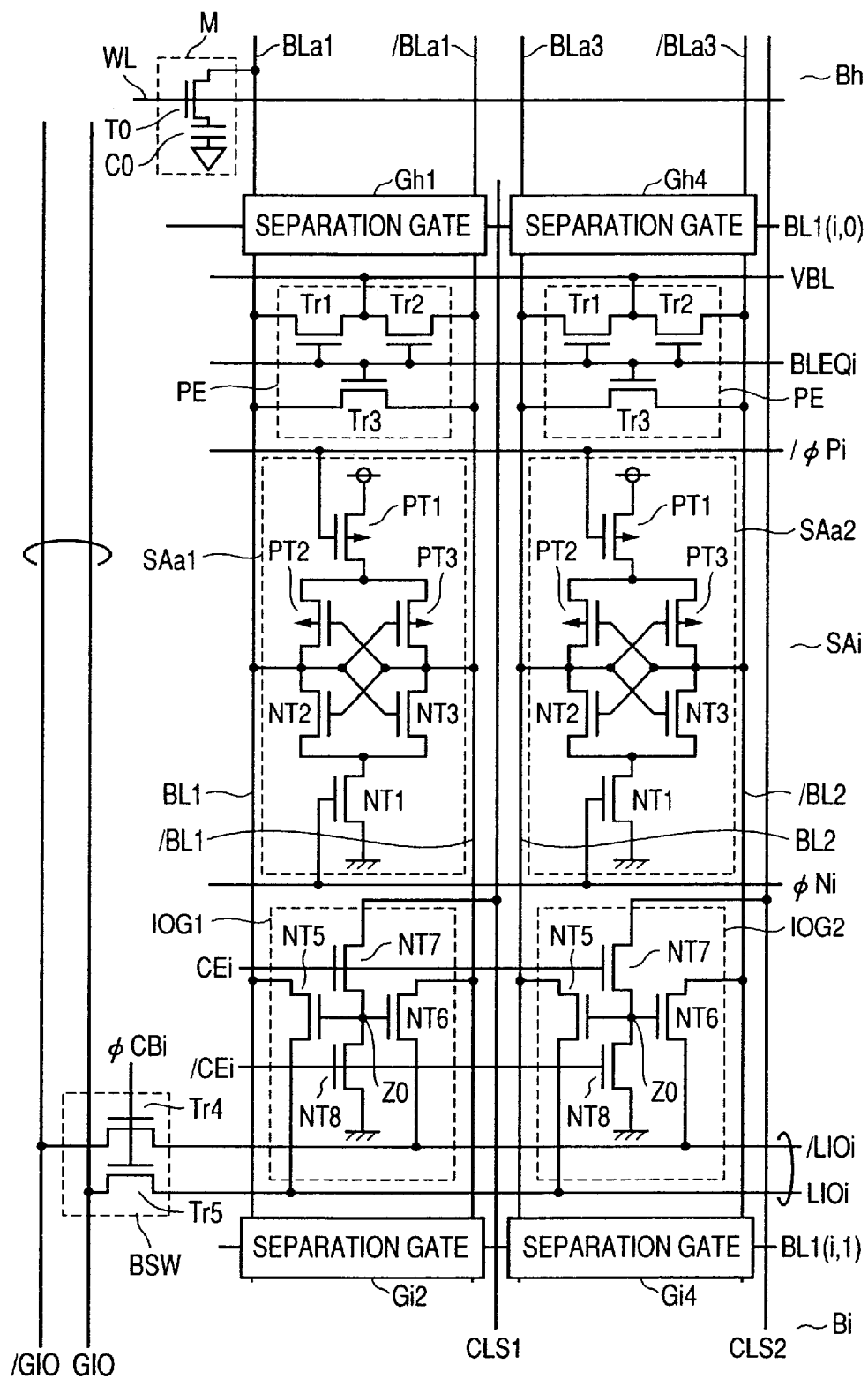
FIG. 8 specifically shows a configuration of the sense amplifier band.

Reference will now be made to FIG. 8 to describe a specific configuration of the sense amplifier band according to the present embodiment of the present invention, referring to sense amplifier band SAi as an example.

As shown in FIG. 8, sense amplifier band SAi includes a bit-line precharge and equalization circuit PE activated in response to equalization signal BLEQi to precharge a bit line pair to a predetermined intermediate potential VBL and thus equalize the bit lines, a sense amplifier activated in response to sense amplifier activation signals $\phi Ni$ and $/\phi Pi$ to differentially amplify a potential of a bit line pair, a local input/output (I/O) line pair LIOi and /LIOi, a column select gate for connecting a bit line pair and local I/O line pair LIOi and /LIOi together, and a select switch BSW for connecting together local line pair LIOi and /LIOi and a global I/O line pair GIO and /GIO shared by all banks. The figure representatively shows sense amplifier SAa1, SAa2, and a column select gate IOG1 provided between sense amplifier SAa1 and local I/O line pair LIOi, /LIOi and a column select gate IOG2 provided between sense amplifier SAa2 and local I/O line pair LIOi, /LIOi. Memory cells Ms included in each bank is each configured of a transistor T0 and a capacitor C0.

The local I/O line pair is arranged for each sense amplifier band, extending in a direction in which a word line extends.

Bit-line precharge and equalization circuit PE includes NMOS transistors Tr1, Tr2 turning on in response to equalization signal BLEQi to transmit a predetermined intermediate potential (precharging potential VBL) to a bit line corresponding thereto, and an NMOS transistor Tr3 turning on in response to equalization signal BLEQi to electrically shortcircuit bit lines corresponding thereto.

Sense amplifiers SAa1, SAa2, . . . includes PMOS transistors PT2 and PT3 cross-coupled together, driving a high-potential one of paired bit lines corresponding thereto to a power supply potential level, NMOS transistors NT2 and NT3 cross-coupled together, driving a low-potential one of paired bit lines corresponding thereto to a ground potential level, a PMOS transistor PT1 arranged between a power supply potential and transistors PT2 and PT3, turning on in response to sense amplifier activation signal $/\phi Pi$, and an NMOS transistor NT1 arranged between a ground potential and transistors NT2 and NT3, turning on in response to sense amplifier activation signal $\phi Ni$. Sense amplifier activation signals $\phi Ni$ and $/\phi Pi$ are opposite in phase. Sense amplifier activation signals $\phi Ni$, $/\phi Pi$ are both output from sense/connection control circuit SIDi.

Adjusting a timing at which sense amplifier activation signals $\phi N$ and $/\phi P$ are activated, so that the signals are both held high for a reduced period of time, allows a through-current to be reduced.

The paired bit lines connected to sense amplifier SAa1 are labeled BL1, /BL1 and the paired bit lines connected to sense amplifier SAa2 are labeled BL2, /BL2.

Column select gate IOG1 includes an NMOS transistor NT5 connected between bit line BL1 and local I/O line LIOi, an NMOS transistor NT6 connected between bit line /BL1 and local I/O line /LIOi, and NMOS transistors NT7 and NT8 connected in series between a signal line transmitting column select signal CSL1 and a ground potential.

Transistor NT7 has a gate receiving interlock signal CEi, and transistor NT8 has a gate receiving a signal /CEi, an inverted version of interlock signal CEi. Transistors NT5 and NT6 have their respective gates connected to a node Z0 connecting transistors NT7 and NT8 together.

Column select gate IOG2 includes transistors NT5, NT6, NT7 and NT8. Transistor NT5 is connected between bit line BL2 and local I/O line LIOi, transistor NT6 is connected between bit line /BL2 and local I/O line /LIOi, and transistors NT7 and NT8 are connected in series between a signal line transmitting column select signal CSL2 and a ground potential.

Column select signals CSL1, CSL2, . . . providing a selection in the column direction, are transmitted on a signal line extending across all banks.

Interlock signal CEi is output from connection control circuit 100 included in sense/connection control circuit SIDi. More specifically, connection control circuit 100 receives column bank address $\phi CBi$ output from bank select signal generating portion 30 included in sense/connection control circuit SIDi and sense amplifier activation signal $\phi Ni$ generated in sense/connection control circuit SIDi, to diive interlock signal CEi high or low.

When interlock signal CEi goes high, transistors NT5 and NT6 turn on in response to a column select signal to connect a bit line pair corresponding thereto to local I/O line pair LIOi, /LIOi.

Select switch BSW is configured of NMOS transistors Tr4 and Tr5. Local I/O line pair LIOi, /LIOi is connected to global I/O line pair GIO, /GIO via select switch BSW conducting in response to column bank address $\phi CBi$. Thus, the global I/O line pair and a local I/O line pair transmitting data read from or written to a selected bank are connected together.

Figure 9:
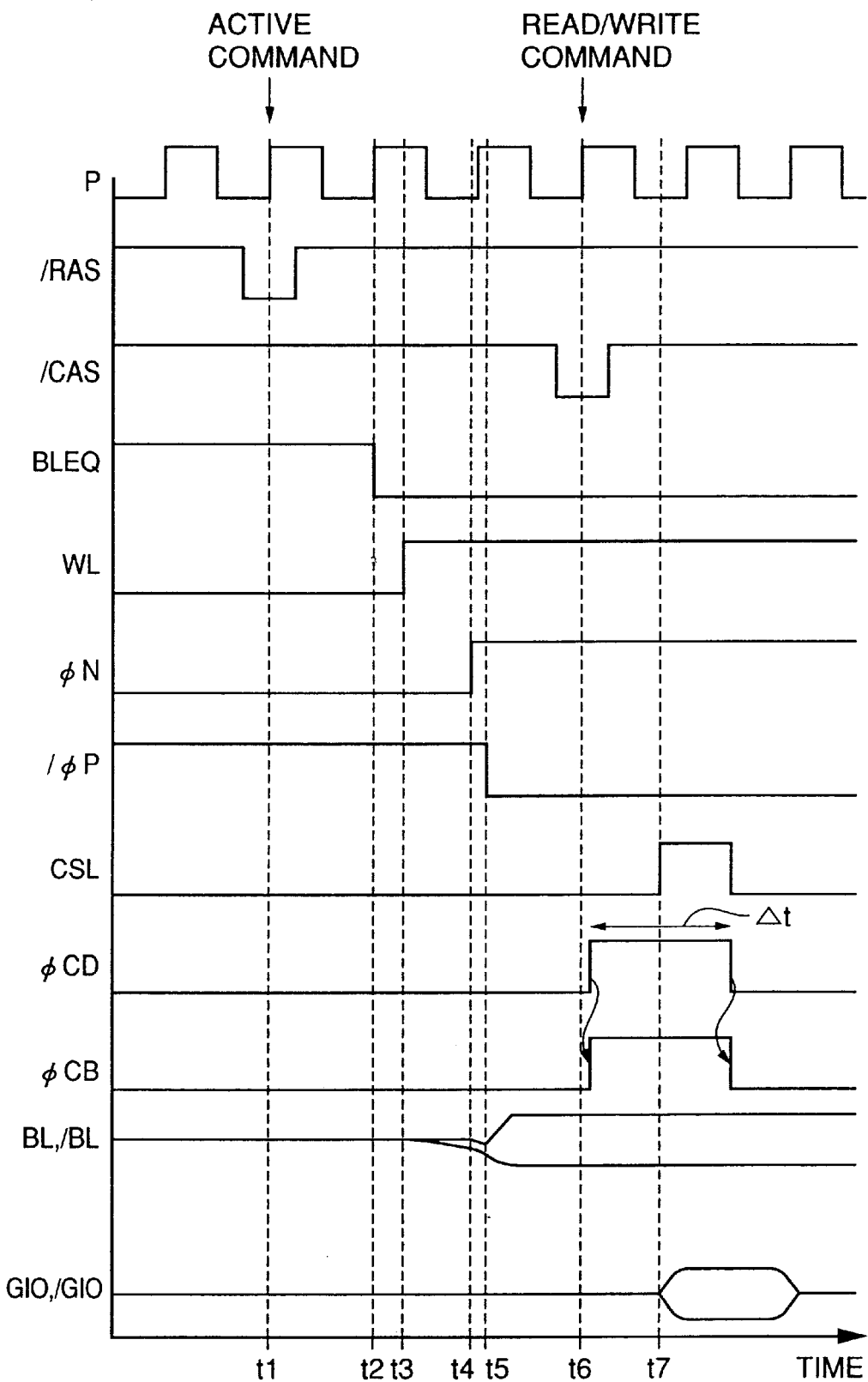
FIG. 9 is timing plots representing an operation of semiconductor memory device 1000 according to an embodiment of the present invention.
Figure 10:
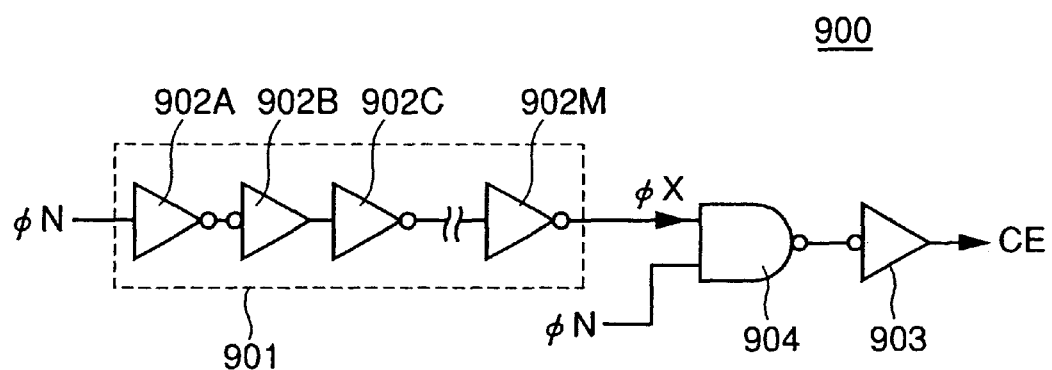
FIG. 10 shows a configuration of a connection control circuit 900 in a conventional semiconductor memory device.
Figure 11:
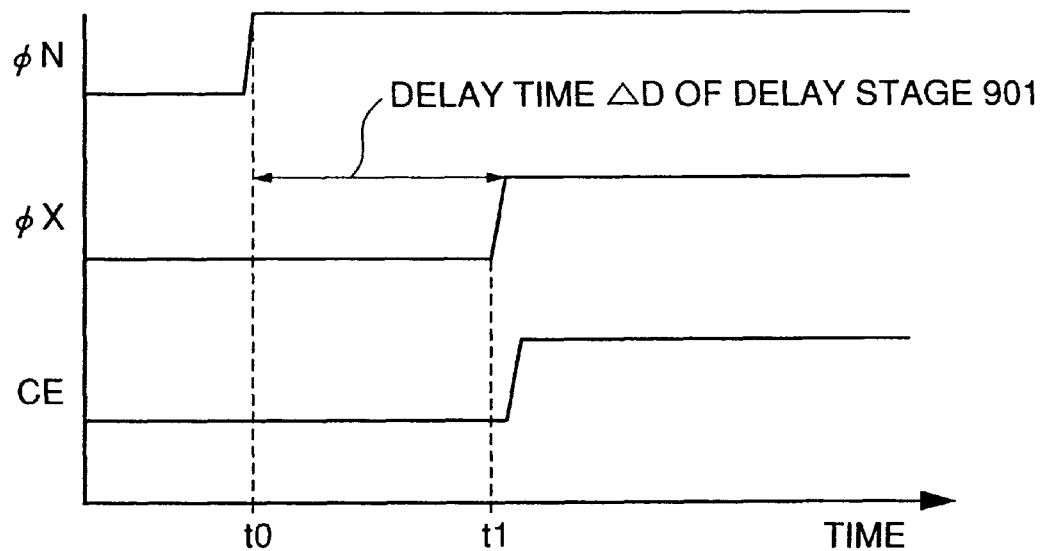
FIG. 11 is timing plots representing an operation of the FIG. 10 connection control circuit 900.

Reference will now be made to FIG. 9 to an operation of semiconductor memory device 1000 according to the present embodiment of the present invention. FIG. 9 shows a relation between a selected bank and a global I/O line pair. In FIG. 9, a read/write command is applied when clock signal P transitions from low to high with row address strobe signal /RAS of high in level, column address strobe signal /CAS of low in level and write enable signal /WE of high or low in level.

At time t1, active command ACT is applied. At time t2, equalization signal BLEQ corresponding to a selected bank is driven low or inactivated. This inactivates bit-line precharge and equalization circuit PE included in a sense amplifier band provided for the selected bank.

Then, at time t3, in the selected bank a selected word line WL rises in potential. This causes a slight potential variation on a bit line in connection to the word line WL of interest.

At time t4, sense amplifier activation signal φN is driven high or activated and transistor NT1 turns on in a sense amplifier provided for the selected bank. At time t5, sense amplifier activation signal /φP is driven low or activated, and transistor PT1 turns on in a sense amplifier provided for the selected bank.

The activated sense amplifier detects and amplifies a slight potential difference between paired bit lines BL and /BL. The series of operation described above completes an operation related to selecting a row.

At time t6, a read/write command is applied. In response to the read/write command a column select operation starts. Simultaneously with the read/write command being decoded, timing signal φCD of high in level is output from command decoder 8. Timing signal φCD remains high for Δt.

Receiving timing signal φCD of high in level, bank decoder 10 drives high column bank designation signal CB corresponding to a bank subjected to a read/write operation and outputs it.

The sense/connection control circuit, receiving column bank designation signal CB of high in level, chives column bank address φCB high. Column bank address φCB remains high for Δt.

At time t7, column decoder 12 is initiated in response to the read/write command to decode an address signal applied thereto and drives column select signal line CSL high. Thus, a column select gate turns on and in a bank subjected to a read/write operation a bit line pair and a local I/O line pair are connected together.

When a read command is applied, data read from a bank subjected to a read operation (i.e., data latched by a sense amplifier) is transmitted on local I/O line pair LIO and /LIO to global I/O line pair GIO and /GIO. The data read onto global I/O line pair GIO and /GIO is output externally via a preamplifier (not shown) and an output buffer (not shown).

When a write command is applied, a write driver (not shown) allows data to be written to a selected memory cell via global I/O line pair GIO and IGIO, local I/O line pair LIO and /LIO, and a sense amplifier band.

Thus in accordance with the present invention a semiconductor memory device includes connection control circuit 100 generating a connection control signal (an interlock signal) controlling a connection between a data input/output I/O line and a bank subjected to a read/write operation. This allows a selected bank and a data input/output line to be disconnected after a sense amplifier is activated and before a read/write command for the selected bank is received. When a read/write command is applied, a selected bank corresponding thereto and a data input/output line can be connectable together.

That is, interlock signal CE can be activated at a uniform timing, which would not be achieved by the conventional connection control circuit 900 using a delay stage to delay sense amplifier activation signal φN to obtain an interlock signal.

Thus, a data input/output line and a bit line can be connected, as controlled at an optimal timing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory blocks each including a plurality of memory cells arranged in rows and columns, and a plurality of word lines and a plurality of bit line pairs;
   a data input/output line allowing said plurality of memory blocks to communicate data externally;
   a select circuit responsive to an address signal for selecting a memory block;
   a control circuit providing control for activating said selected memory block and reading or writing data from or to said selected memory block;
   a gate receiving an active control signal to perform an operation to connect said selected memory block and said data input/output line together; and
   a connection control circuit controlling said operation of said gate, said connection control circuit holding said control signal inactive until a read/write command designating a read or write of said data is input.

2. The semiconductor memory device according to claim 1, further comprising a plurality of sense amplifiers each responsive to an active sense amplifier activation signal for differentially amplifying a potential difference between paired bit lines corresponding thereto, wherein:
   said control circuit includes a circuit activating a sense amplifier activation signal corresponding thereto to activate said selected memory block; and
   said connection control circuit holds said control signal inactive after said sense amplifier activation signal is activated and before said read/write command is input.

3. The semiconductor memory device according to claim 2, wherein:
   said data input/output line includes a plurality of local input/output lines and a global input/output line shared by said plurality of memory blocks;
   said gate includes a plurality of select gates provided for said plurality of local input/output lines, respectively, and a plurality of switches each arranged between a respective one of said plurality of local input/output lines and said global input/output line, said plurality of select gates operating in response to said control signal to allow said selected memory block and a local input/output line corresponding thereto to be electrically connectable together, said plurality of switches selectively connecting said local input/output line associated with said selected memory block and said global input/output line together when said read/write command is input.

4. The semiconductor memory device according to claim 2, further comprising a command decoder decoding a command input thereto, wherein:
   when said command decoder receives said read/write command said command decoder generates a timing signal;
   when said select circuit receives said timing signal said select circuit activates a column bank address designating a memory block subjected to a read or write of said data designated by said address signal; and
   said connection control circuit includes a logic circuit activating said control signal when said logic circuit receives said active sense amplifier activation signal and said column bank address.

5. The semiconductor memory device according to claim 4, wherein said logic circuit is configured of a flip flop having an input receiving said sense amplifier activation signal and said column bank address.

* * * * *